(12) United States Patent
Wilson

(10) Patent No.: US 7,679,405 B2
(45) Date of Patent: Mar. 16, 2010

(54) LATCH-BASED SENSE AMPLIFIER

(75) Inventor: William B. Wilson, Macungie, PA (US)

(73) Assignee: Agere Systems Inc., Allentown, PA (US)

(*) Notice: Subject to any disclaimer, the term of this patent is extended or adjusted under 35 U.S.C. 154(b) by 89 days.

(21) Appl. No.: 11/877,735

(22) Filed: Oct. 24, 2007

(65) Prior Publication Data

US 2009/0108881 A1 Apr. 30, 2009

(51) Int. Cl.
*H03F 3/45* (2006.01)
(52) U.S. Cl. .......................... 327/55; 365/205
(58) Field of Classification Search ............. 327/52, 327/54, 55, 57; 365/205, 207
See application file for complete search history.

(56) References Cited

U.S. PATENT DOCUMENTS

2003/0214867 A1* 11/2003 Goldman et al. ............ 365/207

2009/0108880 A1* 4/2009 Soltanian ..................... 327/52

OTHER PUBLICATIONS

Schinkel, Daniel et al., A Double-Tail Latch-Type Voltage Sense Amplifier with 18ps Setup+Hold Time, Feb. 13, 2007, ISSCC 2007, Session 13, pp. 314-315 and 605, IEEE.*
Schinkel, Daniel et al., A Double-Tail Latch-Type Voltage Sense Amplifier with 18ps Setup+Hold TIme, Feb. 13, 2007, ISSCC 2007, Session 13, pp. 314-315 and 605, IEEE.

* cited by examiner

*Primary Examiner*—Long Nguyen
*Assistant Examiner*—Shikha Goyal
(74) *Attorney, Agent, or Firm*—Hamilton, DeSanctis & Cha

(57) ABSTRACT

Various embodiments of the present invention provide systems and circuits for processing information through comparison of input signals. For example, various embodiments of the present invention provide differential latch circuits. Such differential latch circuits include an input stage and a latch stage. The input stage provides an interim output that is available during a defined period, and the latch stage is operable to latch the temporary interim output during the defined period using a common clock.

20 Claims, 5 Drawing Sheets

LATCH-BASED SENSE AMPLIFIER

BACKGROUND OF THE INVENTION

The present invention is related to systems, circuits and methods for amplifying and/or latching a differential input.

High speed, accurate sense and latch devices form the basis of a sampling system to recover the clock and data in high speed serial data links. In addition, it may be desirable for such sense and latch devices to offer power efficiency and to be less sensitive to process variations and work with a large range of input signal amplitudes and reference voltages to which an input may be compared.

Turning to FIG. 1, a conventional latch based sense amplifier circuit 100 is shown. Sense amplifier circuit 100 includes five N-type transistors 110, 112, 120, 122, 140; and four P-type transistors 130, 132, 134, 136. In particular, a differential pair includes N-type transistor 110 and N-type transistor 112 with the gate of N-type transistor 110 connected to a positive input 102, and the gate of N-type transistor 112 connected to a negative input 104. The sources of N-type transistors 110, 112 are connected to the drain of N-type transistor 140. The gate of N-type transistor 140 is connected to a clock signal 160, and the source thereof is connected to ground. The drain of N-type transistor 110 is connected to the source of N-type transistor 120, and the drain of N-type transistor 112 is connected to the source of N-type transistor 122. The gate of N-type transistor 120 is connected to the gate of P-type transistor 134, and the gate of N-type transistor 122 is connected to the gate of P-type transistor 136. The drain N-type transistor 120 is connected to the drains of P-type transistors 130, 134, and the drain N-type transistor 122 is connected to the drains of P-type transistors 132, 136. The gates of P-type transistors 130, 132 are connected to clock signal 160, and the sources of P-type transistors 130, 132, 134, 136 are connected to a power source (VDD). A negative output 150 is connected to the drains of P-type transistors 130, 134, to the gate of P-type transistor 136 and to the gate of N-type transistor 122; and a positive output 152 is connected to the drains of P-type transistors 132, 136 and to the gate of P-type transistor 134 and to the gate of N-type transistor 120.

In operation, a differential voltage is applied across positive input 102 and negative input 104. When clock signal 160 is asserted high, the voltages Di+ and Di− are discharged at a differential rate controlled by the difference between positive input 102 and negative input 104. The discharge of voltages Di+ and Di− causes transistors 120 and 122 to turn on, and develop a differential voltage across positive output 152 and negative output 150. Such circuits have become very popular as they achieve fast decisions due to the positive feedback in the latch portion of the circuit, and their differential input enables a low offset. Further, this type of circuit offers a high input impedance and an almost rail to rail voltage swing for positive output 152 and negative output 150. However, the stack of transistors used in the circuit requires substantial headroom (i.e., at least four $V_{DS}$) which makes the circuit difficult to implement in low-voltage deep-submicron CMOS technologies.

Turning to FIG. 2, a double tail sense amplifier circuit 200 is presented. Double tail sense amplifier circuit 200 resolves some of the aforementioned problems with headroom. An input stage of double tail sense amplifier circuit 200 includes two N-type transistors 230, 232, two P-type transistors 220, 222, and an N-type transistor 245. The source of P-type transistor 220 and the source of P-type transistor 222 are electrically coupled to a power source (VDD). The gate of P-type transistor 220 and the gate of P-type transistor 222 are electrically coupled to a clock input 210. The drain of P-type transistor 220 is electrically coupled to the drain of N-type transistor 230, and the drain of P-type transistor 222 is electrically coupled to the drain of N-type transistor 232. The gate of N-type transistor 230 is electrically coupled to a positive input 234 (IN+) and the gate of N-type transistor 232 is electrically coupled to a negative input 236 (N−). The source of N-type transistor 230 and the source of N-type transistor 232 are electrically coupled to the drain of N-type transistor 245. The gate of N-type transistor 245 is electrically coupled to clock input 210, and the source of N-type transistor 245 is electrically coupled to ground. The input stage provides a positive output 224 (Di+) from the drain of N-type transistor 230, and a negative output 226 (Di−) from the drain of N-type transistor 232.

A latch stage of double tail sense amplifier circuit 200 includes two differential pairs each including two N-type transistors. A first differential pair includes two N-type transistors 260, 262, and the second differential pair includes two N-type transistors 270, 272. The latch stage further includes two P-type transistors 250, 252, and a P-type transistor 240. The source of P-type transistor 240 is electrically coupled to the power source (VDD), the gate of P-type transistor 240 to an inverted clock 215. The drain of P-type transistor 240 is electrically coupled to the source of P-type transistor 250 and to the source of P-type transistor 252.

The gate of N-type transistor 260 is electrically coupled to negative output 226, and the gate of N-type transistor 272 is electrically coupled to positive output 224. The source of N-type transistor 260, the source of N-type transistor 262, the source of N-type transistor 270 and the source of N-type transistor 272 are electrically coupled to ground. The drain of N-type transistor 260 and the drain of N-type transistor 262 are electrically coupled to the drain of P-type transistor 250. The drain of N-type transistor 270 and the drain of N-type transistor 272 are electrically coupled to the drain of P-type transistor 252. The gate of N-type transistor 262 is electrically coupled to the gate of P-type transistor 250, and the gate of N-type transistor 270 is electrically coupled to the gate of P-type transistor 252. The latch stage provides a positive output 280 (Out+) from the drain of P-type transistor 250, and a negative output 282 (Out−) from the drain of P-type transistor 252.

In operation, a first input is applied to positive input 234 and a second input is applied to negative input 236. When clock input 210 is asserted high (i.e., inverted clock input 215 is asserted low), the voltages at positive output 224 and negative output 236 are discharged at a differential rate controlled by the difference between positive input 234 and negative input 236. The discharge of the voltages at positive output 224 and negative output 226 causes transistors 220 and 222 to turn on, and develop a differential voltage across positive output 224 and negative output 226. The differential voltage between positive output 224 and negative output 226 is regenerated or amplified by the positive feedback of the latch stage. The positive feedback causes a small differential voltage between positive output 224 and negative output 226 to be reflected as an amplified and stored differential voltage between positive output 280 and negative output 282. While the aforementioned circuit provides a reasonable latch based sense amplifier, it requires a differential clock—one clock and an inverted version of that clock. The clock must be distributed in such a way that it transitions at substantially the same time or you get a glitch or the circuit may not work. For example, where the clock skew between clock input 210 and inverted clock input 215 is too great, there is a potential that N-type transistor 245 and P-type transistor 240 would turn on and off out of sync such that the information on positive output 224 and negative output 226 is lost and not latched. Such clock distribution is possible for relatively low frequency operation, but at higher frequency operations such clock distribution becomes costly in terms of semiconductor area and power dissipation, and in any event can be time consuming to implement and test. This problem is exacerbated in situations where a number of the aforementioned circuits are implemented and are required to operate at specified time increments thus multiplying the care that must be taken in distributing the clock and inverted clock signals.

Hence, for at least the aforementioned reasons, there exists a need in the art for advanced systems, circuits and methods for amplifying and/or latching a differential input.

BRIEF SUMMARY OF THE INVENTION

The present invention is related to systems, circuits and methods for amplifying and/or latching a differential input.

Various embodiments of the present invention provide latch-based sense amplifiers. Such latch-based sense amplifiers include an input stage and a latch stage. The input stage includes a first, second and third N-type transistors, and a first and second P-type transistors. The gate of the first N-type transistor is electrically connected to a clock signal, and the source of the first N-type transistor is electrically coupled to a lower voltage potential. The source of the first P-type transistor is electrically coupled to an upper voltage potential, and the gate of the first P-type transistor is electrically connected to the clock signal. The source of the second P-type transistor is electrically coupled to the upper voltage potential, and the gate of the second P-type transistor is electrically connected to the clock signal. The gate of the second N-type transistor is electrically coupled to a first input, the source of the second N-type transistor is electrically coupled the drain of the first N-type transistor, and the drain of the second N-type transistor is electrically coupled to the drain of the first P-type transistor. The gate of the third N-type transistor is electrically coupled to a second input, the source of the third N-type transistor is electrically coupled the drain of the first N-type transistor, and the drain of the third N-type transistor is electrically coupled to the drain of the second P-type transistor. In some cases, the first input may be a variable voltage input and the second input may be a static reference voltage. In other cases, both the first input and the second input are variable input voltages. The input stage further includes a first intermediary signal electrically coupled to the drain of the second N-type transistor and a second intermediary signal electrically coupled to the drain of the third N-type transistor. The latch stage receives the differential output and provides a latch output corresponding to the differential output and synchronous to the clock signal.

In some instances of the aforementioned embodiments, the clock signal synchronizing the latch output is connected only by an electrical conductor to the clock signal applied to the gate of the first N-type transistor. In particular instances of the aforementioned embodiments, the size of the first P-type transistor and the size of the second P-type transistor is greater than the size of the first N-type transistor. In such cases, upon turning the first N-type transistor on at the same time that the first P-type transistor and the second P-type transistor are turned on, the first intermediary signal and the second intermediary signal remain at approximately the upper voltage potential.

Some instances of the aforementioned embodiments, the latch stage includes: a third P-type transistor and a fourth P-type transistor; and a fourth N-type transistor, a fifth N-type transistor, a sixth N-type transistor, a seventh N-type transistor, an eighth N-type transistor, and a ninth N-type transistor. The gate of the fourth N-type transistor is electrically coupled to the second intermediary signal; the gate of the fifth N-type transistor is electrically coupled to the first intermediary signal; the source of the fourth N-type transistor, the source of the fifth N-type transistor, the source of the sixth N-type transistor and the source of the seventh N-type transistor are electrically coupled to the lower voltage potential; the drain of fourth N-type transistor and the drain of the seventh N-type transistor are electrically coupled to the source of the ninth N-type transistor; the drain of fifth N-type transistor and the drain of the sixth N-type transistor are electrically coupled to the source of the eighth N-type transistor; the gate of the sixth N-type transistor is electrically coupled to the drain of the ninth N-type transistor, and the gate of the seventh N-type transistor is electrically coupled to the drain of the eighth N-type transistor; the gate of the eighth N-type transistor and the gate of the ninth N-type transistor are electrically coupled to the clock signal; the drain of the eighth N-type transistor is electrically coupled to the drain of the third P-type transistor, and the drain of the ninth N-type transistor is electrically coupled to the drain of the fourth P-type transistor; the gate of the third P-type transistor is electrically coupled to the drain of the fourth P-type transistor, and the gate of the fourth P-type transistor is electrically coupled to the drain of the third P-type transistor; and the source of the third P-type transistor and the source of the fourth P-type transistor are electrically coupled to the upper voltage potential. In particular instances, the latch output is electrically coupled to the drain of the third P-type transistor. In some instances, the latch output includes a first latch output and a second latch output. In such instances, the first latch output is electrically coupled to the drain of the third P-type transistor, and the second latch output is electrically coupled to the drain of the fourth P-type transistor. In particular instances of the aforementioned embodiments, the latch stage further includes a fifth P-type transistor and a sixth P-type transistor. In such instances, the gate of the fifth P-type transistor and the gate of the sixth P-type transistor are electrically coupled to the clock signal, the source of the fifth P-type transistor and the source of the sixth P-type transistor are electrically coupled to the upper voltage potential, the drain of the fifth P-type transistor is electrically coupled to the drain of the eighth N-type transistor, and the drain of the sixth P-type transistor is electrically coupled to the drain of the ninth N-type transistor. Further, in such instances, the threshold voltages of the fifth P-type transistor and the sixth P-type transistor are larger than the threshold voltages of the first P-type transistor and the second P-type transistor. In various instances of the aforementioned embodiments, the latch-based sense amplifier further includes a level offset circuit. The level offset circuit receives a reference voltage and is operable to offset at least one of the first intermediary signal and the second intermediary signal by a voltage corresponding to the reference voltage.

Other embodiments of the present invention provide differential latch circuits. Such differential latch circuits include and input stage and a latch stage. The input stage provides an interim output during a temporary period relative to a clock signal. The latch stage is operable to latch the interim output during the temporary period using the same clock signal. In some instances of the aforementioned embodiments, the clock signal synchronizing the latch output is connected only by an electrical conductor to the clock signal synchronizing the interim output.

In some instances of the aforementioned embodiments, the interim output is a differential output including a first interim output and a second interim output. In such cases, the input stage includes a first P-type transistor and a second P-type transistor. The clock signal is electrically coupled to the gates of the first P-type transistor and the second P-type transistor, the first interim output is electrically coupled to the drain of the first P-type transistor, and the second interim output is electrically coupled to the drain of the second P-type transistor. The latch stage receives the first interim output and the second interim output. The latch stage includes a third P-type transistor and a fourth P-type transistor, and the a latch output is electrically coupled to the drain of the third P-type transistor. The voltage thresholds of the first P-type transistor, the second P-type transistor, the third P-type transistor and the fourth P-type transistor are matched.

In various instances of the aforementioned embodiments, the input stage further includes: a first N-type transistor, a second N-type transistor, and a third N-type transistor. In such instances, the gate of the first N-type transistor is electrically connected to the clock signal, and the source of the first N-type transistor is electrically coupled to a lower voltage potential; the source of the first P-type transistor and the source of the second P-type transistor are electrically coupled to an upper voltage potential; the gate of the second N-type transistor is electrically coupled to a first input, the source of the second N-type transistor is electrically coupled the drain of the first N-type transistor, and the drain of the second N-type transistor is electrically coupled to the drain of the first P-type transistor; and the gate of the third N-type transistor is electrically coupled to a second input, the source of the third N-type transistor is electrically coupled the drain of the first N-type transistor, and the drain of the third N-type transistor is electrically coupled to the drain of the second P-type transistor. In some such instances, the size of the first P-type transistor and the size of the second P-type transistor are greater than the size of the first N-type transistor, the second N-type transistor, and the third N-type transistor.

In some instances of the aforementioned embodiments, the latch stage further includes: a fourth N-type transistor, a fifth N-type transistor, a sixth N-type transistor, a seventh N-type transistor, an eighth N-type transistor, and a ninth N-type transistor. In such instances, the gate of the fourth N-type transistor is electrically coupled to the second intermediary signal; the gate of the fifth N-type transistor is electrically coupled to the first intermediary signal; the source of the fourth N-type transistor, the source of the fifth N-type transistor, the source of the sixth N-type transistor and the source of the seventh N-type transistor are electrically coupled to the lower voltage potential; the drain of fourth N-type transistor and the drain of the seventh N-type transistor are electrically coupled to the source of the ninth N-type transistor; the drain of fifth N-type transistor and the drain of the sixth N-type transistor are electrically coupled to the source of the eighth N-type transistor; the gate of the sixth N-type transistor is electrically coupled to the drain of the ninth N-type transistor, and the gate of the seventh N-type transistor is electrically coupled to the drain of the eighth N-type transistor; the gate of the eighth N-type transistor and the gate of the ninth N-type transistor are electrically coupled to the clock signal; the drain of the eighth N-type transistor is electrically coupled to the drain of the third P-type transistor, and the drain of the ninth N-type transistor is electrically coupled to the drain of the fourth P-type transistor; the gate of the third P-type transistor is electrically coupled to the drain of the fourth P-type transistor, and the gate of the fourth P-type transistor is electrically coupled to the drain of the third P-type transistor; and the source of the third P-type transistor and the source of the fourth P-type transistor are electrically coupled to the upper voltage potential. In some such instances, the size of the third P-type transistor and the size of the fourth P-type transistor are greater than the size of the sixth N-type transistor, the seventh N-type transistor, the eighth N-type transistor and the ninth N-type transistor.

Yet other embodiments of the present invention provide comparator circuits that include an input stage, a level offset circuit and a latch stage. The input stage exhibits headroom of less than four VDS, receives an input, and provides a differential output including a first intermediary signal and a second intermediary signal that are synchronous to a clock signal. The level offset circuit receives a reference voltage and is operable to offset at least one of the first intermediary signal and the second intermediary signal by a voltage corresponding to the reference voltage. The latch stage receives the differential output and provides a latch output corresponding to the differential output and synchronous to the clock signal.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems, circuits and methods for amplifying and/or latching a differential input.

Some embodiments of the present invention provide latch-based sense amplifiers that are designed to operate on a single-ended clock. As one of many advantages, use of such a latch-based sense amplifier eliminates substantial complexities that are encountered when trying to distribute a differential clock signal on a semiconductor device. Further, some embodiments of the present invention utilize matched devices to reduce processing sensitivity. As another example, some embodiments of the present invention reduce power dissipation through reduction of DC current through the circuit. Based on the disclosure provided herein, one of ordinary skill in the art will recognize a variety of other advantages that may be achieved using one or more embodiments of the present invention.

Figure 1:
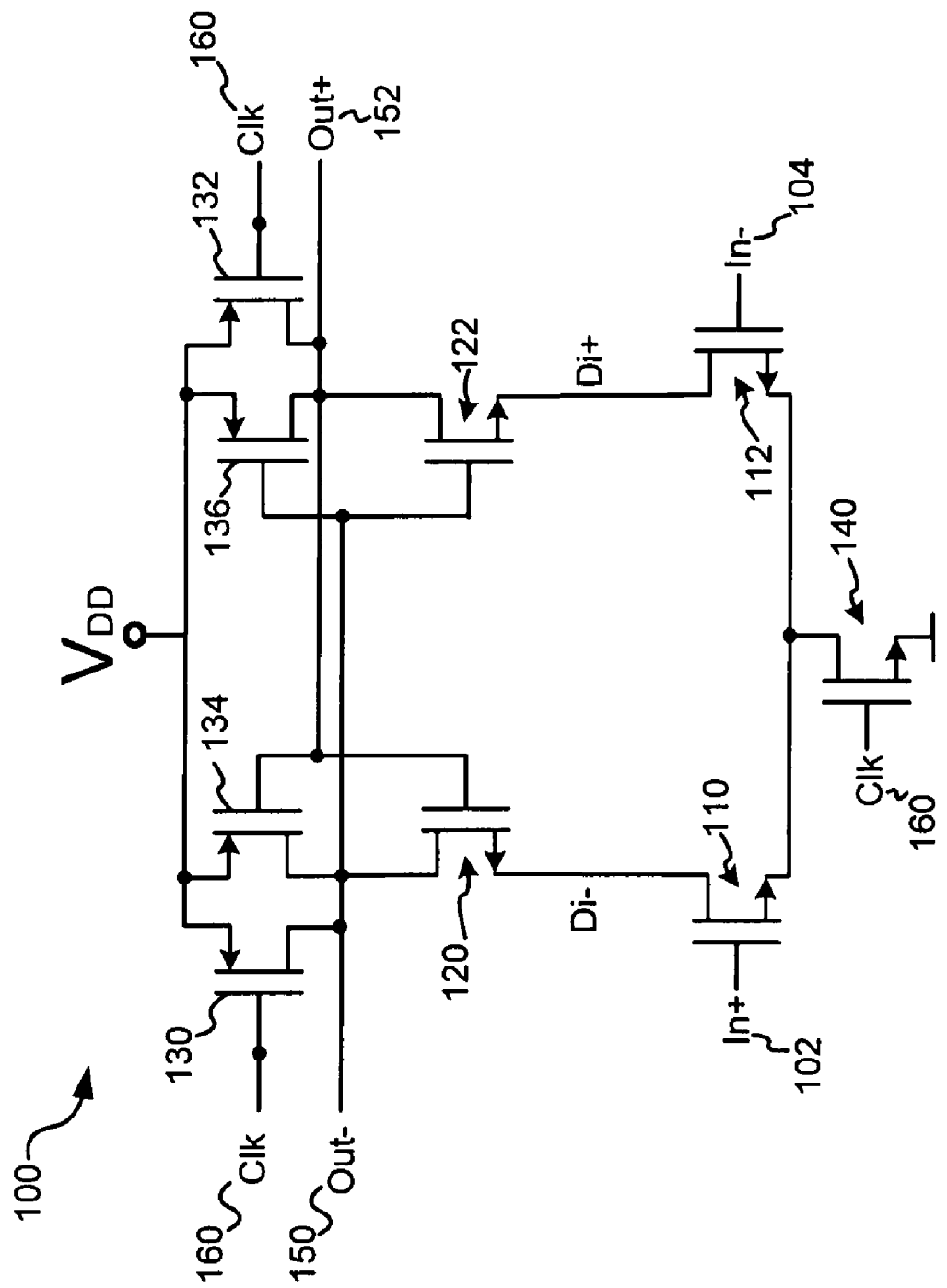
FIG. 1 is a prior art latch-based sense amplifier circuit exhibiting low headroom rendering it impractical for low voltage applications.
Figure 2:
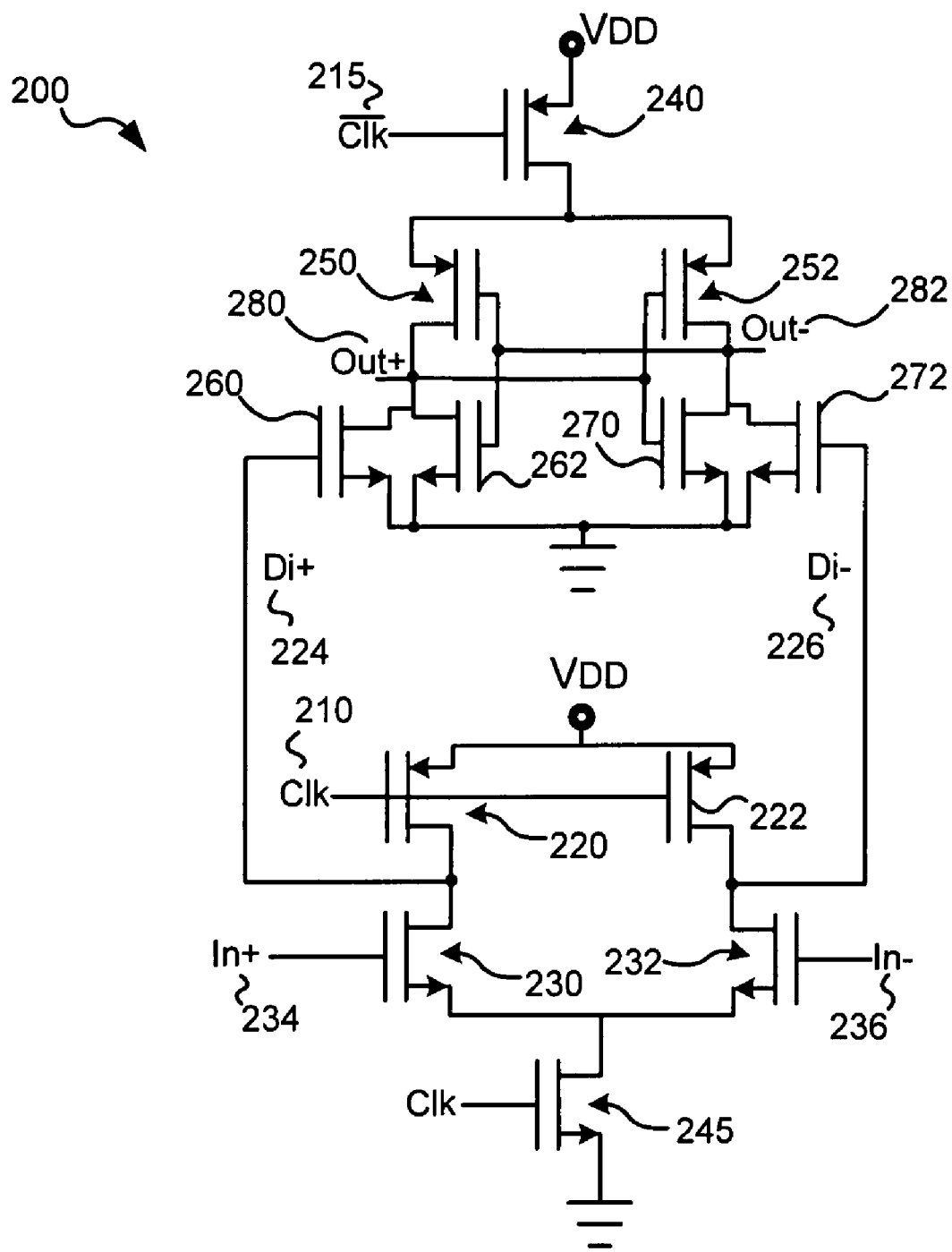
FIG. 2 is a prior art latch-based sense amplifier exhibiting increased headroom, but requiring complex clock distribution rendering it impractical for high frequency applications.
Figure 3:
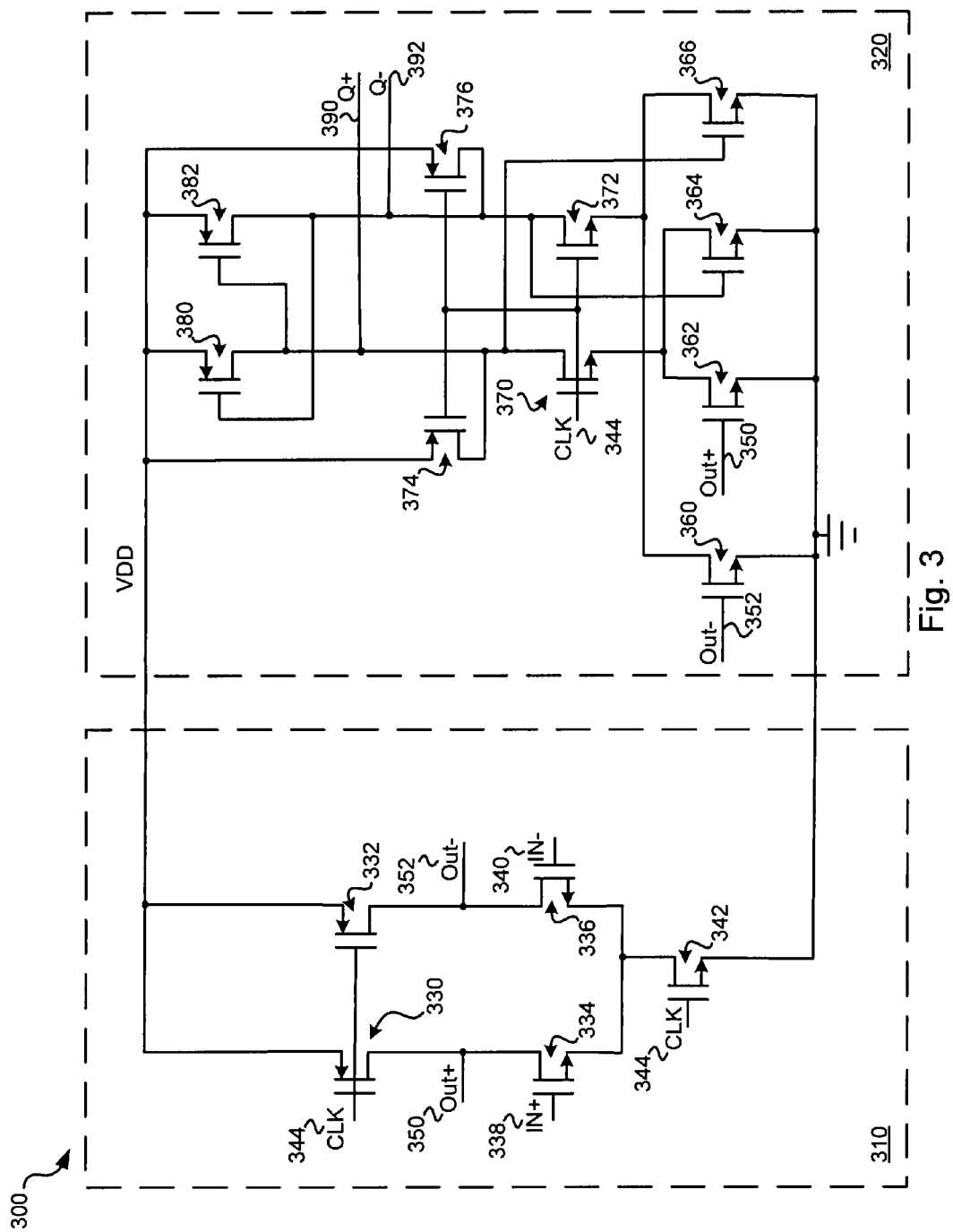
FIG. 3 is a zero crossing, latch-based sense amplifier in accordance with one or more embodiments of the present invention.

Turning to FIG. 3, a zero crossing, latch-based sense amplifier 300 is depicted in accordance with one or more embodiments of the present invention. As used herein, the phrase "zero crossing" is used in its broadest sense to mean that when a voltage above zero is applied it is sensed as one output threshold (e.g., a logic '1'), and when the voltage is less than zero, it is sensed as the opposite output threshold (e.g., a logic '0'). Sense amplifier 300 includes an input stage 310 (shown in dashed lines) and a latch stage 320 (shown in dashed lines). Input stage 310 includes two P-type transistors 330, 332; and three N-type transistors 334, 336, 342. The gate of N-type transistor 334 is electrically coupled to a positive input (IN+) 338, and the gate of N-type transistor 336 is electrically coupled to a negative input (IN−) 340. The sources of N-type transistor 334 and N-type transistor 336 are electrically coupled to the drain of N-type transistor 342. The gate of N-type transistor 342 is electrically coupled to a clock signal 344, and the source of N-type transistor 342 is electrically coupled to a ground. The drain of N-type transistor 334 is electrically coupled to the drain of P-type transistor 330, and the drain of N-type transistor 336 is electrically coupled to the drain of P-type transistor 332. The sources of P-type transistor 330 and P-type transistor 332 are electrically coupled to a power source (VDD). The gates of P-type transistor 330 and P-type transistor 332 are electrically coupled to clock signal 344. Input stage 310 provides a positive output (Out+) 350 electrically coupled to the drain of P-type transistor 330, and a negative output (Out−) 352 electrically coupled to the drain of P-type transistor 332.

Latch stage 320 includes six N-type transistors 360, 362, 364, 366, 370, 372; and four P-type transistors 374, 376, 380, 382. The gate of N-type transistor 360 is electrically coupled to negative output 352, and the gate of N-type transistor 362 is electrically coupled to positive output 350. The sources of N-type transistors 360, 362, 364, 366 are all electrically coupled to ground. The drains of N-type transistors 360, 366 are electrically coupled to the source of N-type transistor 372, and the drains of N-type transistors 362, 364 are electrically coupled to the source of N-type transistor 370. The gate of N-type transistor 364 is electrically coupled to the drain of N-type transistor 372, and the gate of N-type transistor 366 is electrically coupled to the drain of N-type transistor 370. The gates of N-type transistors 370, 372 are electrically coupled to clock signal 344, and to the gates of P-type transistors 374, 376. The drain of N-type transistor 370 is electrically coupled to the drain of P-type transistor 374 and to the drain of P-type transistor 380, and the drain of N-type transistor 372 is electrically coupled to the drain of P-type transistor 376 and to the drain of P-type transistor 382. The sources of P-type transistors 374, 376 are electrically coupled to the power source. The gate of P-type transistor 380 is electrically coupled to the drain of P-type transistor 382, and the gate of P-type transistor 382 is electrically coupled to the drain of P-type transistor 380. The sources of P-type transistors 380, 382 are electrically coupled to the power source. A positive output 390 (Q+) is electrically coupled to the drain of P-type transistor 380, and a negative output 392 (Q−) is electrically coupled to the drain of P-type transistor 382.

In operation, a differential voltage is applied across positive input 338 and negative input 340, or a single ended voltage may be applied to one of positive input 338 or negative input 340 with the other of positive input 338 or negative input 340 being electrically coupled to a reference voltage. When clock signal 344 transitions from low to high, N-type transistor 342 turns on causing the voltages at positive output 350 and negative output 352 to discharge at a differential rate controlled by the difference between the voltages on positive input 338 and negative input 340. Thus, for a brief period of time, the difference between positive output 350 and negative output 352 reflects the difference between positive input 338 and negative input 340. In one particular embodiment of the present invention, P-type transistors 330, 332 are relatively large compared with N-type transistor 342. In this way, when N-type transistor 342 is initially turned on (i.e., clock signal 344 is asserted high), positive output 350 and negative output 352 remain stable (i.e., approximately VDD) until P-type transistors 330, 332 are completely turned off. This ensures the differential voltage between positive output 350 and negative output 352 is maximized at the right time for sampling by latch stage 320.

Latch stage 320 receives positive output 350 and negative output 352, and samples and latches the aforementioned outputs on the rising edge of clock signal 344 to create positive output 390 and negative output 392. By using the same clock (i.e., clock signal 344), N-type transistor 342 will turn off a predictable and short time before P-type transistors 374, 376 turn on because of the natural characteristics of N-type and P-type devices. This provides for a natural synchronization between input stage 310 and latch stage 320 using a common clock. Thus, some embodiments of the present invention offer an advantage of simplified and less costly clock distribution when compared with prior art circuits. In addition, some embodiments of the present invention provide increased headroom when compared with other prior art circuits. As used herein, the term "headroom" is used to mean the difference between an upper voltage potential and a lower voltage potential less the number of stacked transistors between the upper voltage potential and the lower voltage potential multiplied by a standard value for drain to source voltage drop ($V_{DS}$). Thus, latch-based sense amplifier 300 exhibits the following headroom:

$$\text{headroom} = VDD - \text{Ground} - 3V_{DS}.$$

Thus, the headroom of latch-based sense amplifier 300 may be expressed simply as $3V_{DS}$.

In particular, P-type transistor 374 pre-charges the value of positive output 390 and P-type transistor 376 pre-charges the value of negative output 392 SO that latch stage 320 is in a high gain condition when clock input signal 344 is asserted high. N-type transistors 370, 372 substantially reduce any DC currents traversing latch stage 320 by preventing current flow when latch stage 320 is in the pre-charge state. In some embodiments, N-type transistors 370, 372 exhibit a threshold voltage that is substantially the same as that for N-type transistor 342. This means that N-type transistors 370, 372 are closed and in a low series resistance state when P-type transistors 330, 332, 374, 376 are released and the decision is made.

As clock signal 344 transitions from low to high, a differential voltage reflecting the difference between positive input 338 and negative input 340 is exhibited across positive output 390 and negative output 392 when clock signal 344 gets sufficiently near the upper rail (i.e., VDD) so as to turn P-transistors 374, 376 off. Of note, N-type transistors 370, 372 have already turned on by the time clock signal 344 is high enough to turn P-type transistors 330, 332, 374, 376 off. The positive feedback connection exhibited by the connection of N-type transistors 364, 366 and P-type transistors 380, 382 causes positive output 390 to drive to one rail (e.g., ground or VDD) and negative output 392 to drive toward the other rail (e.g., VDD or ground). In particular embodiments of the present invention, the threshold voltages of P-type transistors 374, 376 are chosen to be slightly larger than that for P-type transistors 330, 332 to accommodate for mismatches in threshold voltages. By doing so, latch stage 320 will be enabled slightly before input stage 310 is enabled. It should be noted that some embodiments of the present invention utilize a D-type flip-flop (not shown) connected to positive output 390 and/or negative output 392 that may be used to buffer the output(s) to other downstream logic devices.

Figure 4:
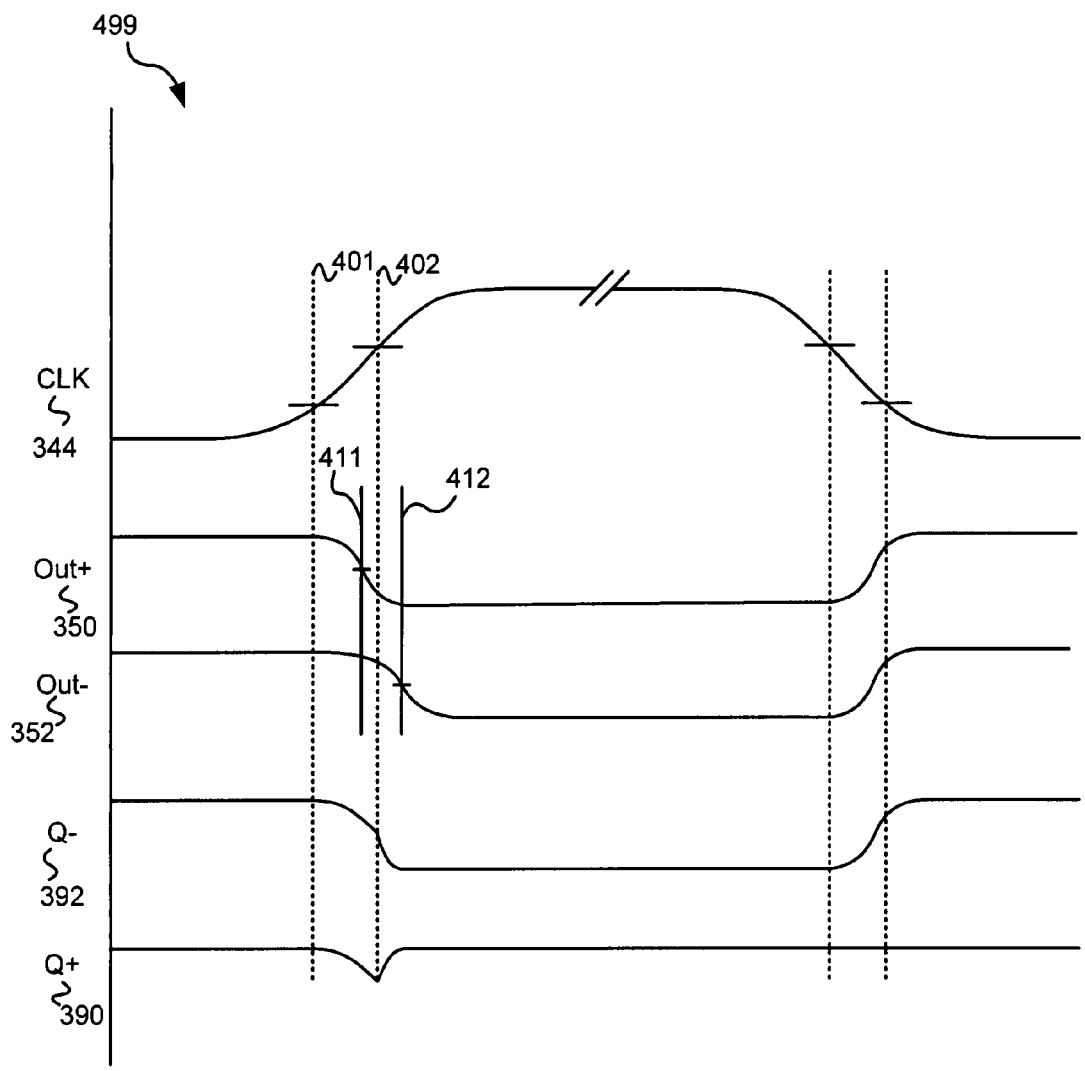
FIG. 4 is a timing diagram showing an exemplary timing of various output signals of the latch-based sense amplifier of FIG. 3 in relation to a clock input.

Turning to FIG. 4, a timing diagram 499 shows the timing of positive output 350, negative output 352, positive output 390 and negative output 392 relative to clock signal 344 for a condition where positive input 338 is greater than positive output 340. Timing diagram 499 further shows a turn on point of N-type transistors 401 and a turn off point of P-type transistors 402. As shown, as clock signal 344 transitions from low to high, N-type transistor 342 turns on (i.e., at point 401) before P-type transistors 330, 332 turn off (i.e., at point 402). Because of this, the differential pair consisting of N-type transistor 334 and N-type transistor 336 has a large gain. Once point 402 is achieved, positive output 350 and negative output 352 begin discharging toward ground. In this case, positive input 338 is greater than negative input 340, and thus positive output 350 discharges more quickly than negative output 352. This disparate discharge rate is reflected in positive output 390 and negative output 392. Once clock signal 344 transitions from high to low, the outputs are recharged to approximately VDD. A temporary period when the latch stage is available to sample positive output 350 and negative output 352 extends from the approximate midpoint of positive output 350 (shown as a line 411) and the approximate midpoint of negative output 352 (shown as a line 412). It should be noted that the depicted timing is merely exemplary and that other timing may be achieved in accordance with different embodiments of the present invention.

Figure 5:
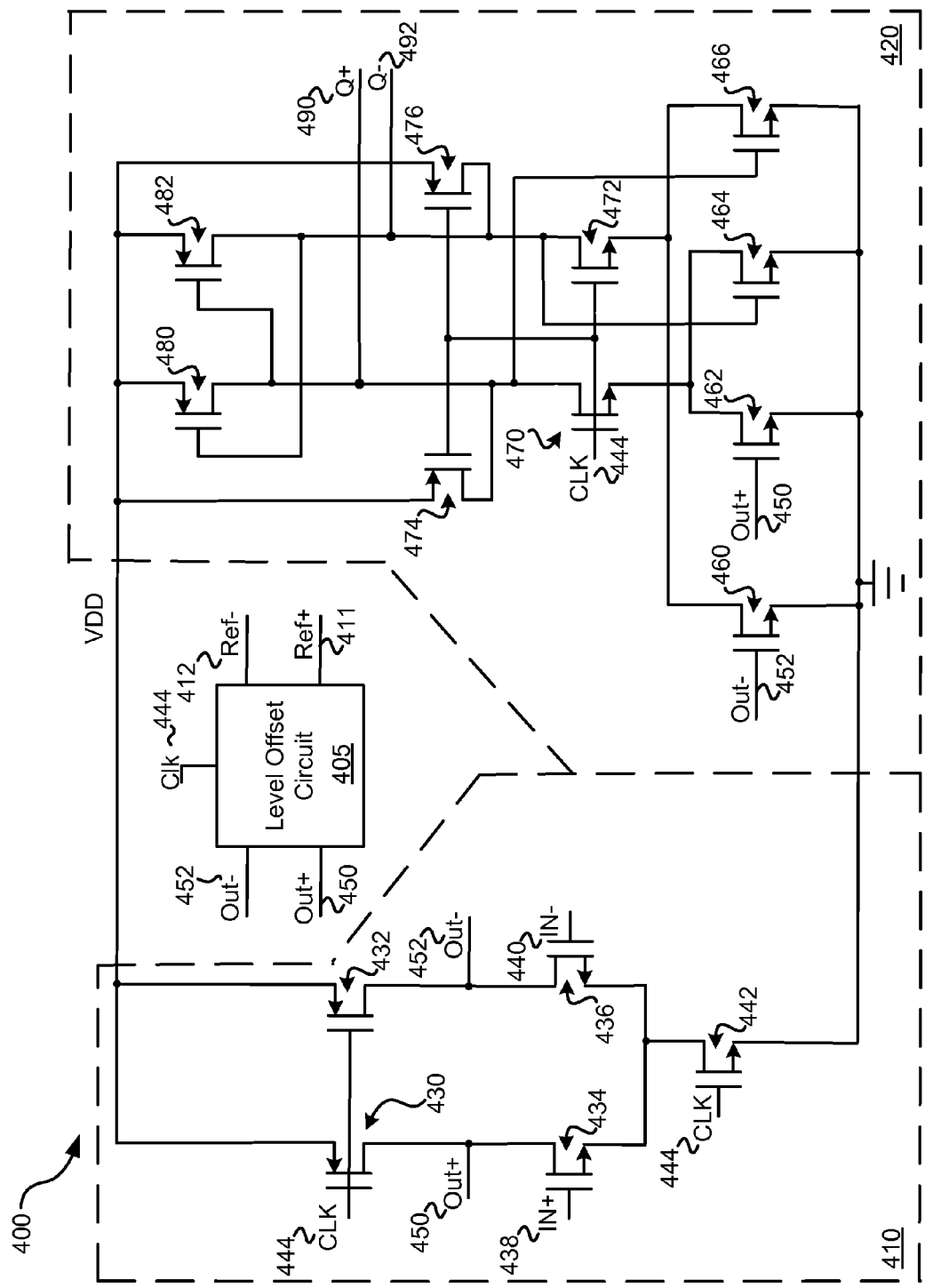
FIG. 5 is a latch-based sense amplifier including a voltage offset in accordance with other embodiments of the present invention.

Turning to FIG. 5, a latch-based sense amplifier 400 including a level offset circuit 405 is shown in accordance with other embodiments of the present invention. Sense amplifier 400 includes an input stage 410 (shown in dashed lines) and a latch stage 420 (shown in dashed lines). Input stage 410 includes two P-type transistors 430, 432; and three N-type transistors 434, 436, 442. The gate of N-type transistor 434 is electrically coupled to a positive input (IN+) 438, and the gate of N-type transistor 436 is electrically coupled to a negative input (IN−) 440. The sources of N-type transistor 434 and N-type transistor 436 are electrically coupled to the drain of N-type transistor 442. The gate of N-type transistor 442 is electrically coupled to a clock signal 444, and the source of N-type transistor 442 is electrically coupled to a ground. The drain of N-type transistor 434 is electrically coupled to the drain of P-type transistor 430, and the drain of N-type transistor 436 is electrically coupled to the drain of P-type transistor 432. The sources of P-type transistor 430 and P-type transistor 432 are electrically coupled to a power source (VDD). The gates of P-type transistor 430 and P-type transistor 432 are electrically coupled to clock signal 444.

Input stage 410 provides a positive output (Out+) 450 electrically coupled to the drain of P-type transistor 430, and a negative output (Out−) 452 electrically coupled to the drain of P-type transistor 432. Level offset circuit 405 receives a clock signal 444 and a voltage reference including a positive reference 411 and a negative reference 412, and injects a charge corresponding to the reference voltage into the decision node of input stage 410 (i.e., to positive output 450 and negative output 452). Said another way, the voltage reference is applied to positive output 450 and negative output 452 to create an input stage that is something other than a zero-crossing input stage. Thus, for example, where the voltage reference is one hundred milli-volts, the difference between positive input 438 and negative input 440 will need to exceed one hundred milli-volts before a switch in positive output 450 and negative output 452 is noted. Level offset circuit 405 may be any circuit known in the art for applying a voltage offset to an output value. Based on the disclosure provided herein, one of ordinary skill in the art will recognize a variety of offset circuits that may be used in place of level offset circuit 405.

Latch stage 420 includes six N-type transistors 460, 462, 464, 466, 470, 472; and four P-type transistors 474, 476, 480, 482. The gate of N-type transistor 460 is electrically coupled to negative output 452, and the gate of N-type transistor 462 is electrically coupled to positive output 450. The sources of N-type transistors 460, 462, 464, 466 are all electrically coupled to ground. The drains of N-type transistors 460, 466 are electrically coupled to the source of N-type transistor 472, and the sources of N-type transistors 462, 464 are electrically coupled to the source of N-type transistor 470. The gate of N-type transistor 464 is electrically coupled to the drain of N-type transistor 472, and the gate of N-type transistor 466 is electrically coupled to the drain of N-type transistor 470. The gates of N-type transistors 470, 472 are electrically coupled to clock signal 444, and to the gates of P-type transistors 474, 476. The drain of N-type transistor 470 is electrically coupled to the drain of P-type transistor 474 and to the drain of P-type transistor 480, and the drain of N-type transistor 472 is electrically coupled to the drain of P-type transistor 476 and to the drain of P-type transistor 482. The sources of P-type transistors 474, 476 are electrically coupled to the power source. The gate of P-type transistor 480 is electrically coupled to the drain of P-type transistor 482, and the gate of P-type transistor 482 is electrically coupled to the drain of P-type transistor 480. The sources of P-type transistors 480, 482 are electrically coupled to the power source. A positive output 490 (Q+) is electrically coupled to the drain of P-type transistor 480, and a negative output 492 (Q−) is electrically coupled to the drain of P-type transistor 482. The operation of latch-based sense amplifier 400 is substantially the same as that of latch-based sense amplifier 300 except that a voltage offset may be applied to provide a non-zero crossing input stage.

In conclusion, the invention provides novel systems, circuits, methods and arrangements for sensing and/or comparing input signals. While detailed descriptions of one or more embodiments of the invention have been given above, various alternatives, modifications, and equivalents will be apparent to those skilled in the art without varying from the spirit of the invention. For example, one or more embodiments of the present invention may be extended to compare more than two input signals. Therefore, the above description should not be taken as limiting the scope of the invention, which is defined by the appended claims.

What is claimed is:
1. A latch-based sense amplifier, the latch-based sense amplifier comprising:
   an input stage; and
   a latch stage, wherein the latch stage is electrically coupled to the input stage, wherein the latch stage includes:
      a third P-type transistor and a fourth P-type transistor;
      a fourth N-type transistor, a fifth N-type transistor, a sixth N-type transistor, a seventh N-type transistor, an eighth N-type transistor, and a ninth N-type transistor; and wherein the gate of the fourth N-type transistor is electrically coupled to the second intermediary signal; the gate of the fifth N-type transistor is electrically coupled to the first intermediary signal; the source of the fourth N-type transistor, the source of the fifth N-type transistor, the source of the sixth N-type transistor and the source of the seventh N-type transistor are electrically coupled to the lower voltage potential; the drain of fourth N-type transistor and the drain of the seventh N-type transistor are electrically coupled to the source of the ninth N-type transistor; the drain of fifth N-type transistor and the drain of the sixth N-type transistor are electrically coupled to the source of the eighth N-type transistor; the gate of the sixth N-type transistor is electrically coupled to the drain of the ninth N-type transistor, and the gate of the seventh N-type transistor is electrically coupled to the drain of the eighth N-type transistor; the gate of the eighth N-type transistor and the gate of the ninth N-type transistor are electrically coupled to the clock signal; the drain of the eighth N-type transistor is electrically coupled to the drain of the third P-type transistor, and the drain of the ninth N-type transistor is electrically coupled to the drain of the fourth P-type transistor; the gate of the third P-type transistor is electrically coupled to the drain of the fourth P-type transistor, and the gate of the fourth P-type transistor is electrically coupled to the drain of the third P-type transistor; and the source of the third P-type transistor and the source of the fourth P-type transistor are electrically coupled to the upper voltage potential.

2. The latch-based sense amplifier of claim 1, wherein the input stage includes:
a first N-type transistor, wherein the gate of the first N-type transistor is electrically connected to a clock signal, and the source of the first N-type transistor is electrically coupled to a lower voltage potential;
a first P-type transistor, wherein the source of the first P-type transistor is electrically coupled to an upper voltage potential, and the gate of the first P-type transistor is electrically connected to the clock signal;
a second P-type transistor, wherein the source of the second P-type transistor is electrically coupled to the upper voltage potential, and the gate of the second P-type transistor is electrically connected to the clock signal;
a second N-type transistor, wherein the gate of the second N-type transistor is electrically coupled to a first input, the source of the second N-type transistor is electrically coupled the drain of the first N-type transistor, and the drain of the second N-type transistor is electrically coupled to the drain of the first P-type transistor;
a third N-type transistor, wherein the gate of the third N-type transistor is electrically coupled to a second input, the source of the third N-type transistor is electrically coupled the drain of the first N-type transistor, and the drain of the third N-type transistor is electrically coupled to the drain of the second P-type transistor; and
a differential output, wherein the differential output includes a first intermediary signal electrically coupled to the drain of the second N-type transistor and a second intermediary signal electrically coupled to the drain of the third N-type transistor.

3. The latch-based sense amplifier of claim 1, wherein the clock signal synchronizing the latch output is connected only by an electrical conductor to the clock signal applied to the gate of the first N-type transistor.

4. The latch-based sense amplifier of claim 1, wherein the latch-based sense amplifier further includes:
a level offset circuit, wherein the level offset circuit receives a reference voltage and is operable to offset at least one of the first intermediary signal and the second intermediary signal by a voltage corresponding to the reference voltage.

5. The latch-based sense amplifier of claim 1, wherein the amplifier is incorporated in a system.

6. The latch-based sense amplifier of claim 2, wherein the latch stage receives the differential output and provides a latch output corresponding to the differential output and synchronous to the clock signal, and wherein the latch output is electrically coupled to the drain of the third P-type transistor.

7. The latch-based sense amplifier of claim 6, wherein the first input is selected from a group consisting of: a variable input voltage and a static reference voltage.

8. The latch-based sense amplifier of claim 6, wherein both of the first input and the second input are variable input voltages.

9. The latch-based sense amplifier of claim 6, wherein the size of the first P-type transistor and the size of the second P-type transistor is greater than the size of the first N-type transistor.

10. The latch-based sense amplifier of claim 9, wherein upon turning the first N-type transistor on at the same time that the first P-type transistor and the second P-type transistor are turned on, the first intermediary signal and the second intermediary signal remain at approximately the upper voltage potential.

11. The latch-based sense amplifier of claim 6, wherein the latch output includes a first latch output and a second latch output, and wherein the first latch output is electrically coupled to the drain of the third P-type transistor, and the second latch output is electrically coupled to the drain of the fourth P-type transistor.

12. The latch-based sense amplifier of claim 6, wherein the latch stage further includes:
a fifth P-type transistor and a sixth P-type transistor; and
wherein the gate of the fifth P-type transistor and the gate of the sixth P-type transistor are electrically coupled to the clock signal, the source of the fifth P-type transistor and the source of the sixth P-type transistor are electrically coupled to the upper voltage potential, the drain of the fifth P-type transistor is electrically coupled to the drain of the eighth N-type transistor, and the drain of the sixth P-type transistor is electrically coupled to the drain of the ninth N-type transistor.

13. The latch-based sense amplifier of claim 12, wherein the threshold voltages of the fifth P-type transistor and the sixth P-type transistor are larger than the threshold voltages of the first P-type transistor and the second P-type transistor.

14. A differential latch circuit, the circuit comprising:
an input stage, wherein the input stage provides an interim output during a temporary period relative to a clock signal; and
a latch stage, wherein the latch stage is operable to latch the interim output during the temporary period using the clock signal, and wherein the latch stage includes:
a fourth N-type transistor, a fifth N-type transistor, a sixth N-type transistor, a seventh N-type transistor, an eighth N-type transistor, and a ninth N-type transistor; and
wherein the gate of the fourth N-type transistor is electrically coupled to the second intermediary signal; the gate of the fifth N-type transistor is electrically coupled to the first intermediary signal; the source of the fourth N-type transistor, the source of the fifth N-type transistor, the source of the sixth N-type transistor and the source of the seventh N-type transistor are electrically coupled to the lower voltage potential; the drain of fourth N-type transistor and the drain of the seventh N-type transistor are electrically coupled to the source of the ninth N-type transistor; the drain of fifth N-type transistor and the drain of the sixth N-type transistor are electrically coupled to the source of the eighth N-type transistor; the gate of the sixth N-type transistor is electrically coupled to the drain of the ninth N-type transistor, and the gate of the seventh N-type transistor is electrically coupled to the drain of the eighth N-type transistor; the gate of the eighth N-type transistor and the gate of the ninth N-type transistor are electrically coupled to the clock signal; the drain of the eighth N-type transistor is electrically coupled to the drain of the third P-type transistor, and the drain of the ninth N-type transistor is electrically coupled to the drain of the fourth P-type transistor; the gate of the third P-type transistor is electrically coupled to the drain of the fourth P-type transistor, and the gate of the fourth P-type transistor is electrically coupled to the drain of the third P-type transistor; and the source of the third P-type transistor and the source of the fourth P-type transistor are electrically coupled to the upper voltage potential.

15. The differential latch circuit of claim 14, wherein the interim output is a differential output including a first interim output and a second interim output, and wherein:
the input stage includes a first P-type transistor and a second P-type transistor, wherein the clock signal is electrically coupled to the gates of the first P-type transistor and the second P-type transistor, wherein the first interim output is electrically coupled to the drain of the first P-type transistor, and wherein the second interim output is electrically coupled to the drain of the second P-type transistor;
the latch stage receives the first interim output and the second interim output, wherein the latch stage includes a third P-type transistor and a fourth P-type transistor, and wherein the a latch output is electrically coupled to the drain of the third P-type transistor; and
wherein the voltage thresholds of the first P-type transistor, the second P-type transistor, the third P-type transistor and the fourth P-type transistor are matched.

16. The differential latch circuit of claim 15, wherein the input stage further includes:
a first N-type transistor, a second N-type transistor, and a third N-type transistor; and
wherein the gate of the first N-type transistor is electrically connected to the clock signal, and the source of the first N-type transistor is electrically coupled to a lower voltage potential; wherein the source of the first P-type transistor and the source of a second P-type transistor are electrically coupled to an upper voltage potential; wherein the gate of the second N-type transistor is electrically coupled to a first input, the source of the second N-type transistor is electrically coupled the drain of the first N-type transistor, and the drain of the second N-type transistor is electrically coupled to the drain of the first P-type transistor; and wherein the gate of the third N-type transistor is electrically coupled to a second input, the source of the third N-type transistor is electrically coupled the drain of the first N-type transistor, and the drain of the third N-type transistor is electrically coupled to the drain of the second P-type transistor.

17. The differential latch circuit of claim 16, wherein the size of the first P-type transistor and the size of the second P-type transistor are greater than the size of the first N-type transistor, the second N-type transistor, and the third N-type transistor.

18. The differential latch circuit of claim 14, wherein the size of the third P-type transistor and the size of the fourth P-type transistor are greater than the size of the sixth N-type transistor, the seventh N-type transistor, the eighth N-type transistor and the ninth N-type transistor.

19. The differential latch circuit of claim 15, wherein the clock signal synchronizing the latch output is connected only by an electrical conductor to the clock signal synchronizing the first interim output and the second interim output.

20. The differential latch circuit of claim 14, wherein the circuit is incorporated in a system.

* * * * *